United States Patent [19]
Skahill et al.

[11] Patent Number: 6,121,940
[45] Date of Patent: *Sep. 19, 2000

[54] APPARATUS AND METHOD FOR BROADBAND MATCHING OF ELECTRICALLY SMALL ANTENNAS

[75] Inventors: George Skahill, Greenlawn; Ronald M. Rudish, Commack; John A. Pierro, East Meadow, all of N.Y.

[73] Assignee: Ail Systems, Inc., Deer Park, N.Y.; a part interest

[ * ] Notice: This patent issued on a continued prosecution application filed under 37 CFR 1.53(d), and is subject to the twenty year patent term provisions of 35 U.S.C. 154(a)(2).

[21] Appl. No.: 09/128,168

[22] Filed: Aug. 3, 1998

Related U.S. Application Data
[60] Provisional application No. 60/057,623, Sep. 4, 1997.

[51] Int. Cl.$^7$ ............................................. H01Q 1/50
[52] U.S. Cl. .................................... 343/860; 343/701
[58] Field of Search ..................... 343/701, 860, 343/850, 856; 455/291; 333/32; H01Q 1/26, 1/50

[56] References Cited

U.S. PATENT DOCUMENTS

| | | | |
|---|---|---|---|
| 3,714,659 | 1/1973 | Firman | 343/701 |
| 3,716,867 | 2/1973 | Mayes et al. | 343/701 |
| 3,953,799 | 4/1976 | Albee | 343/701 |
| 4,383,260 | 5/1983 | Ryan | 343/701 |
| 4,442,434 | 4/1984 | Baekgaard | 343/701 |
| 5,296,866 | 3/1994 | Sutton | 343/701 |
| 5,311,198 | 5/1994 | Sutton | 343/701 |
| 5,402,133 | 3/1995 | Merenda | 343/701 |

OTHER PUBLICATIONS

J.D. Quirin, "A study of high frequency solid–state negative–impedance converters for impedance loading of dipole antennas", Masters Thesis, University of Illinois at Urbana Champaign, 1971.

"Proceedings of the Workshop on Electrically Small Antennas," U.S. Army Electronics Command, May 6 & 7, 1976.

Fulvio Capparelli, Antonino Liberatore, "Variable Frequency Crystal Oscillator Using Variable Negative Inductance or Capacitance," Proceedings of the IEEE, Aug. 1970, pp. 1298–1299.

(List continued on next page.)

Primary Examiner—Hoanganh Le
Attorney, Agent, or Firm—Hoffmann & Baron, LLP

[57] ABSTRACT

A broadband impedance matching circuit employs active circuits featuring non-Foster reactance behavior, such as negative capacitor circuits and negative inductor circuits, to achieve extremely broadband matching of electrically small antennas. The matching circuit includes at least one non-Foster reactance circuit selected to neutralize the reactance exhibited by the antenna. The circuit further includes a dynamic dispersive impedance transformer circuit which compensates for the frequency dependent radiation resistance presented by the electrically small antenna. The dynamic dispersive impedance transformer is constructed using complementary Foster and non-Foster reactance circuits configured as an impedance transformer.

17 Claims, 13 Drawing Sheets

OTHER PUBLICATIONS

S. A. Boctor, "Active Realization of a Negative Inductor," Proceedings of the 11'th annual asimolar conference on circuit systems and computers, Nov. 1977, pp. 70–74.

T.S. MacLean, P.A. Ramsdale, "Signal/Noise ratio for short integrated antennas," *Electronics Letters*, Feb. 6, 1975, vol. 11, No. 3, pp. 62–63.

R.L. Brennan, T.R. Viswanathan, J.N. Hanson, "The CMOS negative impedance converter," *IEEE Journal of Solid State Circuits*, vol. 23, No. 5, Oct. 1988, pp. 1272–1275.

A.S. Sedra, G.W. Roberts, F. Gohn; "The current conveyor: history, progess and new results," IEE Proceedings, vol. 137, Pt G, No. 2, Apr. 1990. pp. 78–87.

George Skahill, John Piero, "Electrically small, efficient, wide–band, low–noise antenna elements," Aug. 31, 1997, Final Report for Defense Advanced Research rojects Agency Contract #DAAH01–96–C–R303, ARPA Order No. D611, Amdt 05.

George Skahill, "Small efficient, wide–band, low noise antenna elements," Jan. 7, 1997, Quarterly Report for Defense Advanced Research Projects Agency Contrac #DAAH01–96–C–R303, ARPA Order No. D611, Amdt 05.

R. Stevens, F.A. Myers, "Temperature compensation of gunn oscillators," *Electronics Letters*, vol. 10, No. 22, Oct. 31, 1974.

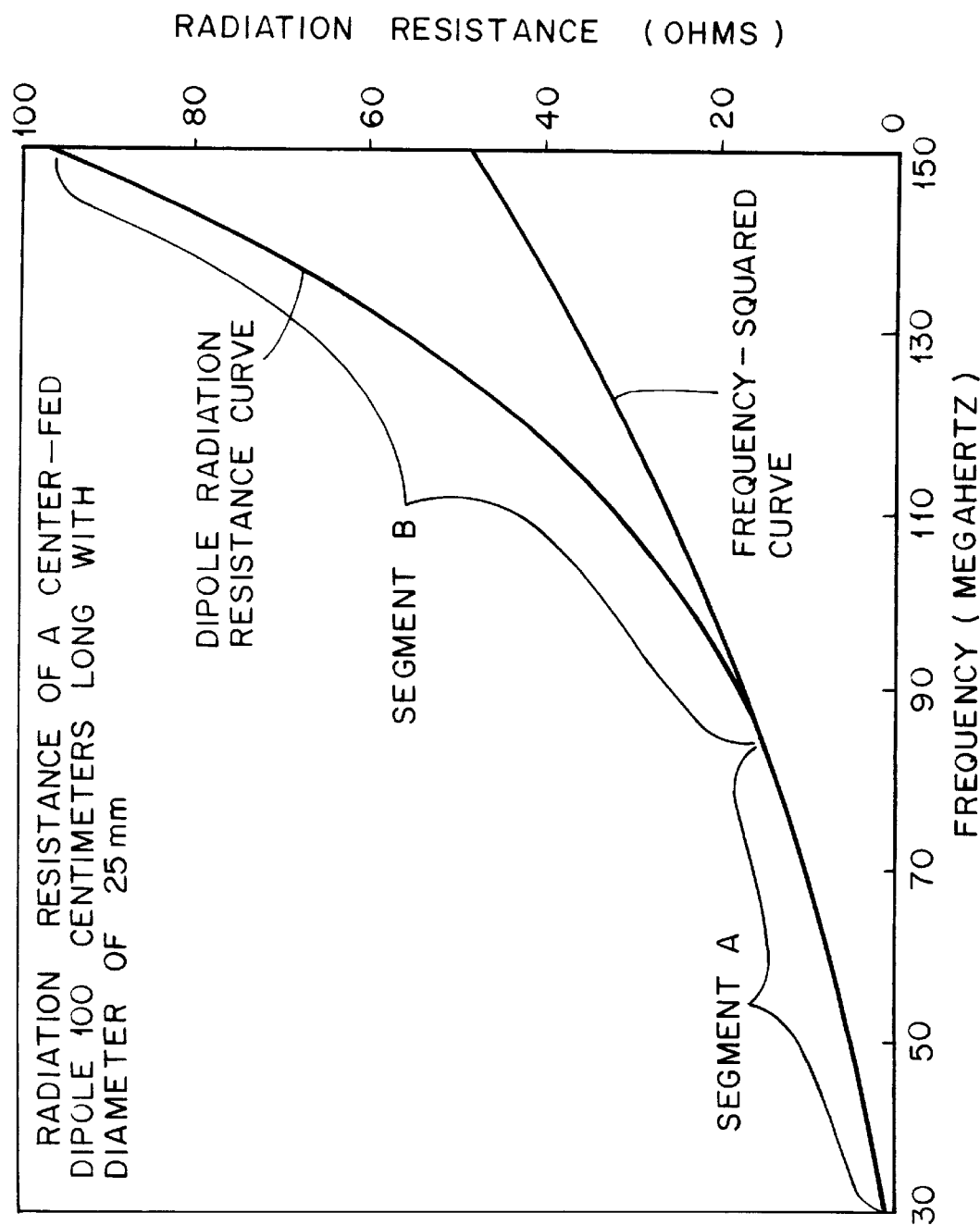

100.01 MHz 0.01 MHz

FREQUENCY = 0.01 TO 100.01 MEGAHERTZ

APPARATUS AND METHOD FOR BROADBAND MATCHING OF ELECTRICALLY SMALL ANTENNAS

This application claims the benefit of U.S. Provisional Patent Application Ser. No. 60/057,623 filed on Sep. 4, 1997 entitled "Apparatus and Method for Broadband Matching of Electrically Small Antennas."

BACKGROUND OF THE INVENTION

1. Field of the Invention

The present invention relates generally to impedance matching in radio frequency circuits, and more particularly relates to active impedance matching of electrically small antennas to achieve broadband impedance matching.

2. Description of the Prior Art

In a radio frequency circuit, the impedance of a source or load is characterized by a resistive component and a reactive component. The two components can be viewed as orthogonal vectors with the resultant impedance being the sum of these two vectors. Methods of complex algebra are commonly used to describe electrical impedances with the real part of an impedance representing its resistive component and the imaginary part of the impedance representing its reactive component. As the frequency of operation changes for a typical broadband circuit, the value of the resistive component remains substantially constant while the value of the reactive component changes.

To achieve maximum power transfer in a radio frequency circuit, a circuit receiving a signal (load) should have an impedance with its resistance equal to the resistance of the impedance of the circuit generating the signal (source) and a reactance that is equal in magnitude but of opposite sign to the reactance of the circuit generating the signal. When the load and source are of different impedances, it is desirable to interpose an impedance matching circuit between the source and the load to transform the source and load impedances to a common value, usually the characteristic impedance (which is a real, and not complex, quantity) of the transmission line connecting the source and the transformed load. When the source and the load are properly matched to the characteristic impedance, maximum power transfer is achieved and signal reflections are minimized.

In the arithmetic of complex variables, the condition for maximum power transfer is obtained when the circuit receiving a signal has an impedance (or admittance) which is the complex conjugate of the impedance (or admittance) of the circuit generating the signal.

For passive circuits, the reactive component is capacitive, inductive or a combination of these parameters. For a capacitive reactance, the reactance of the circuit varies according to the equation:

$$X_c = \frac{-1}{2 \cdot \pi \cdot F \cdot C}$$

where F is the frequency of operation and C is the capacitance value of the circuit. The frequency dependent nature of the capacitive reactance can readily be appreciated by use of a graphical impedance chart, such as a Smith chart illustrated in FIG. 1. Referring to FIG. 1, the capacitive reactance is infinite at direct current (DC) 2 and becomes progressively smaller with increasing frequency. This is represented as a clockwise rotation about the outside circle of the chart, toward the lower half (negative reactance) region of the chart.

Similarly, for inductive circuits, the reactance varies according to the equation:

$$X_l = 2 \cdot \pi \cdot F \cdot L$$

where F is the frequency of operation and L is the inductance value of the circuit. Again referring to FIG. 1, the inductive reactance at DC 4 is zero ohms and progressively increases into the upper portion (positive reactance) of the chart with increasing frequency. This frequency dependence is seen as a clockwise rotation about the chart from the zero Ω point 4. The behavior of such conventional passive, bilateral reactive components complies with Foster's reactance theorem which states that the impedance of any passive circuit is characterized by a reactance that exhibits a positive slope with frequency at all frequencies. As such, these components can be said to exhibit Foster impedances, and, since their resistance values are very small, they can be said to exhibit Foster reactances, that is, a Foster impedance having a negligible resistance.

In a typical impedance matching circuit, it is a common objective to neutralize the reactive components of a load such that only a resistive component remains. From FIG. 1, it can be seen that capacitive reactance is negative (current lagging) while inductive reactance is positive (current leading). In the simplest case, without regard to impedance transformation, the cancellation of a load with capacitive reactance requires an inductive reactance of equal magnitude. In a similar fashion, for inductive loads, a capacitive reactance of equal magnitude is required to cancel the inductive reactive component.

However, as is illustrated in FIG. 1, the magnitudes of both the inductive and capacitive reactance vary with frequency. Further, the magnitudes of the reactance vary in opposite directions. Therefore, using conventional capacitive and inductive components, the total reactance can be eliminated at only a single frequency known as the resonant frequency of the circuit.

In order to overcome the problem of single frequency reactance cancellation, active circuits have been employed to create "negative capacitance" and "negative inductance" values. These active circuits attempt to create reactances which mirror those of the corresponding positive capacitance and inductance, respectively. Such reactance characteristics violate Foster's reactance theorem and, therefore, can be generally referred to as non-Foster reactances. Referring to the Smith chart of FIG. 2, a curve 6 of capacitive reactance for a conventional capacitor is illustrated between a first frequency, F1, and a second frequency, F2. This curve follows the characteristics described in FIG. 1 for a capacitive reactance. FIG. 2 further illustrates a theoretical curve 8 between F1 and F2 for a negative capacitor of equal magnitude to the positive capacitor.

The curve 8 for the negative capacitor begins with a high positive reactance which becomes smaller with frequency (counter clockwise rotation). At all frequencies, this capacitive reactance is exactly equal and opposite to that of the conventional capacitor curve 6. Therefore, for a circuit which combines these two elements, reactive cancellation will occur at all frequencies, rather than just one.

Various circuit topologies have been experimented with in an effort to achieve both negative capacitors and negative inductors which exhibit low loss, non-Foster impedance properties at radio frequencies. Several topologies for negative inductors are illustrated in the article "The Design of Active Floating Positive and Negative Inductors in MMIC Technology", S. El Khoury, IEEE Microwave and Guided Wave Letters, Vol. 5, No. 10, October 1995. Exemplary topologies for realizing active negative capacitors are disclosed in the article "An NIC-Based Negative capacitance circuit for Microwave Active Filters," Sussman-Fort et al., International Journal of Microwave and Millimeter-Wave Computer Aided Engineering, Vol. 5, No. 4, 271–277 (1995). Each of these articles is incorporated herein by reference.

FIG. 3 is a simplified schematic diagram of a negative inductor circuit disclosed in the Khoury article. The circuit includes an input field effect transistor (FET) 10, an output FET 12, a coupling FET 14 and a capacitor 16. The FET's 10,12,14 are conventional devices each having a gate terminal, a source terminal and a drain terminal. The gate terminal of the input FET 10 functions as the input terminal of the negative inductor circuit. The gate terminal of the input FET 10 also receives a feedback signal from the drain terminal of the output FET 12. The input FET 10 generates a differential signal between the source terminal and drain terminal. The coupling FET 14 is interposed between the input FET 10 and output FET 12 to provide additional gain and isolation. The source terminal of the coupling FET 14 is connected to the drain terminal of the input FET 10. The drain terminal of the coupling FET 14 is connected to the gate terminal of the output FET 12. The gate terminal of the coupling FET 14 is connected to the source terminal of both the input FET 10 and output FET 12. The capacitor 16 is coupled across the drain and gate of the output FET 12. The output FET 12, which is configured as an inverting transconductance device, transforms the capacitance from gate to source into a negative inductance.

FIG. 4 illustrates an exemplary circuit topology of a negative capacitor circuit disclosed in the Sussman-Fort et al. article. The circuit illustrated employs two FET's 18,20 to transform a capacitance from a capacitor 22 into a negative capacitance. The circuit is described as a two port negative impedance converter. The first port is an input port and is taken at the source terminal of the first FET 18. The second port is connected to the drain of the first FET 18. The capacitor 22 is connected between the second port and circuit ground. The gate terminal of the first FET 18 is connected to the drain terminal of the second FET 20. This junction has a return path to circuit ground through a first resistor 24. The gate terminal of the second FET 20 is connected to the drain terminal of the first FET 18. The source terminal of the second FET 20 has a return path to circuit ground through a second resistor 26. The parameters of the components in this circuit are determined using computer aided design techniques which are described in detail in the Sussman-Fort et al. article.

A commonly encountered component in a radio frequency circuit is an antenna. Antennas typically present complex load impedances which vary significantly with frequency. FIG. 5 illustrates a simplified diagram of a signal source 30 driving an antenna 32. Interposed between the source 30 and antenna 32 is an impedance matching circuit 34. Conventional narrow band impedance matching circuits 34 are designed to transform the impedance presented by the antenna 32 to the complex conjugate of the impedance of the source 30 at a specific frequency or approximately over a small band of frequencies.

The complicated antenna impedance is affected by a number of characteristics including the electrical length of the antenna. The electrical length of an antenna is expressed in wavelengths of the operating frequency of the antenna. When an antenna is fabricated with an electrical length significantly less than one-half wavelength, it is commonly referred to as an electrically small antenna.

In general, the impedance of an electrically small antenna may be modeled by a simple parallel resonant circuit (small loop antennas) or by a simple series resonant circuit (small dipole antennas). The smaller the antenna the more faithfully the simple resonant circuit models replicate actual antenna behavior with respect to their inductance and capacitance and radiation resistance. However, it should be kept in mind that when the antenna is so small that its radiation resistance is comparable to the loss resistance associated with the antenna, then the loss resistance must be taken into account in the model.

FIG. 6 illustrates a model of a small dipole antenna. Referring to FIG. 6, the antenna 32 is modeled as a resistor 36, a capacitor 38 and an inductor 40 all connected in series. Both the capacitor 38 and inductor 40 act similarly to conventional components and present a frequency dependent reactance as previously discussed, and illustrated in FIG. 1. However, the resistor 36 in the antenna model has two components, the radiation resistance of the antenna, $R_r$, and a loss resistance $R_L$. For the electrically small antennas considered here, the loss resistance is usually much less than the radiation resistance, and will be treated as zero ohms for the sake of simplicity. Unlike a conventional resistor, $R_r$ is a frequency dependent variable for the antenna 32. The magnitude of the radiation resistance increases as the frequency squared. The resistance and reactance variations for an exemplary small dipole antenna are illustrated graphically in FIGS. 7A and 7B respectively.

For any given frequency of operation, the antenna 32 presents a known impedance to the impedance matching circuit 34. The impedance matching circuit 34 can be designed to cancel the net reactance of the antenna inductance 40 and capacitance 38 as well as to transform the radiation resistance 36 to match the impedance of the source 30. However, as the frequency of operation changes, the impedance of the antenna 32 also changes and the simple matching circuit 34 formed with conventional Foster reactance components no longer presents the proper impedance to the source 30. This results in an undesirable impedance mismatch between the signal source 30 and antenna 32.

An attempt to overcome the problem of broad band impedance matching of an antenna using a negative inductor circuit is described in U.S. Pat. No. 5,296,866 to Sutton. The Sutton patent is directed to low frequency antennas, especially large pick up coils well suited for detecting low frequency electromagnetic waves. The Sutton patent employs a low frequency operational amplifier circuit configured as a negative inductor to cancel the large positive inductive reactance presented by the coil. In low frequency pick up coils, the large amount of wire used presents a large resistance which does not change with frequency. The Sutton patent discloses the use of an active "negative resistance" circuit whose resistance is independent of frequency to cancel a large portion of this resistance. However, the Sutton patent does not teach or suggest means for broad band matching of an electrically small antenna.

OBJECTS AND SUMMARY OF THE INVENTION

It is an object of the present invention to provide a broad band impedance match for an electrically small antenna.

It is another object of the present invention to provide a broad band impedance matching circuit for an electrically small antenna using active components.

It is yet another object of the present invention to provide an active circuit which reduces the Q of an electrically small antenna.

It is a further object of the present invention to provide an impedance matching circuit which compensates for the frequency dependent reactance and radiation resistance exhibited by an electrically small antenna.

It is a further object of the present invention to provide a dynamic dispersive impedance transformer circuit formed from active components to compensate for the frequency-squared variation in radiation resistance presented by electrically small antennas.

It is still a further object of the present invention to provide a broad band matching circuit for an electrically small antenna using active non-Foster reactance components.

It is still a further object of the present invention to provide a broad band matching circuit for an electrically small antenna using active components to form negative capacitor circuits and negative inductor circuits.

It is yet a further object of the present invention to provide a broadband matching circuit and electrically small antenna which overcomes the "fundamental limitation of small antennas," stated through Fano's gain-bandwidth theorem, that an antenna's gain-bandwidth product is proportional to its effective volume.

It is still another object of the present invention to provide a method of broadband impedance matching an electrically small antenna.

In accordance with one form of the present invention, a broadband active impedance matching circuit for an electrically small antenna is formed using a non-Foster reactance circuit to neutralize the Foster reactance of the antenna. The matching circuit further includes a dynamic dispersive impedance transformer circuit which receives the frequency dependent radiation resistance from the antenna and presents a substantially frequency independent resistance value to a connected signal source or load.

The dynamic dispersive impedance transformer circuit is formed having a first reactance circuit and a second reactance circuit, where one of the first and second reactance circuits exhibits Foster reactance behavior and the other exhibits non-Foster reactance behavior. The first reactance circuit is selected to have a reactance value substantially equal and opposite to that of the second reactance circuit. The first and second reactance circuits are preferably operatively configured to form an L-network.

The dynamic dispersive impedance transformer circuit may also include a third reactance circuit. The third reactance circuit is selected to have a reactance value substantially equal to that of the first reactance circuit. With the inclusion of the third reactance circuit, the dynamic dispersive transformer circuit may be configured as a T-network π-network.

In accordance with another form of the present invention, an active impedance matching circuit for an electrically small antenna is formed using negative capacitor and negative inductor circuits. The matching circuit includes a negative capacitor circuit selected to have a magnitude equal and opposite to the magnitude of the antenna's positive capacitive component. The matching circuit further includes a negative inductor circuit selected to have a reactance equal and opposite to the antenna's inductive component. The negative capacitor circuit and negative inductor circuit are operatively configured as a resonant circuit which neutralizes the Foster reactance of the antenna. The matching circuit also includes a dynamic dispersive impedance transformer. The dynamic dispersive transformer is formed with at least one non-Foster reactance circuit and presents a frequency dependent transformation ratio which compensates for the frequency dependent radiation resistance of the antenna.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 9A is a graph of radiation resistance versus frequency for a 100 cm dipole antenna referred to in FIG. 9.

DETAILED DESCRIPTION OF THE PREFERRED EMBODIMENTS

Figure 6:
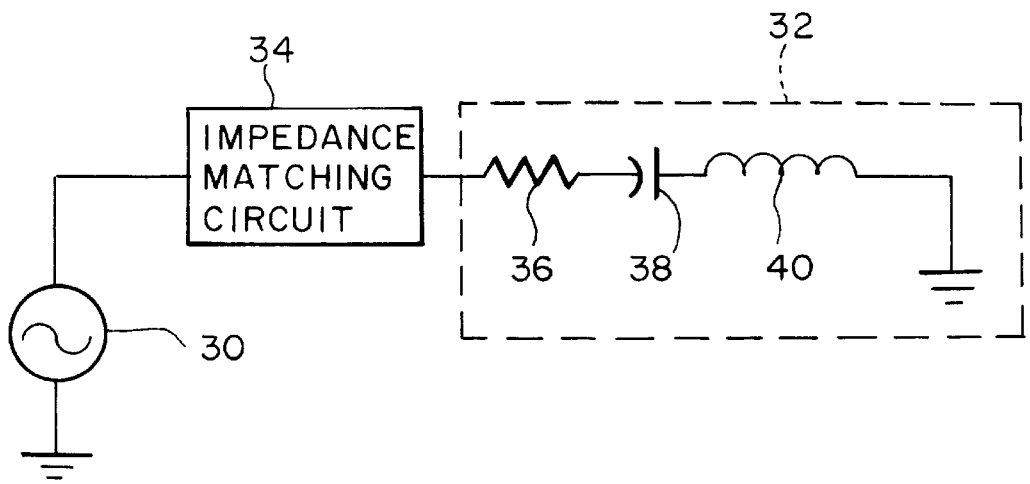
FIG. 6 is an electrical diagram further showing an equivalent electrical model for an antenna, known in the prior art.
Figure 7B:
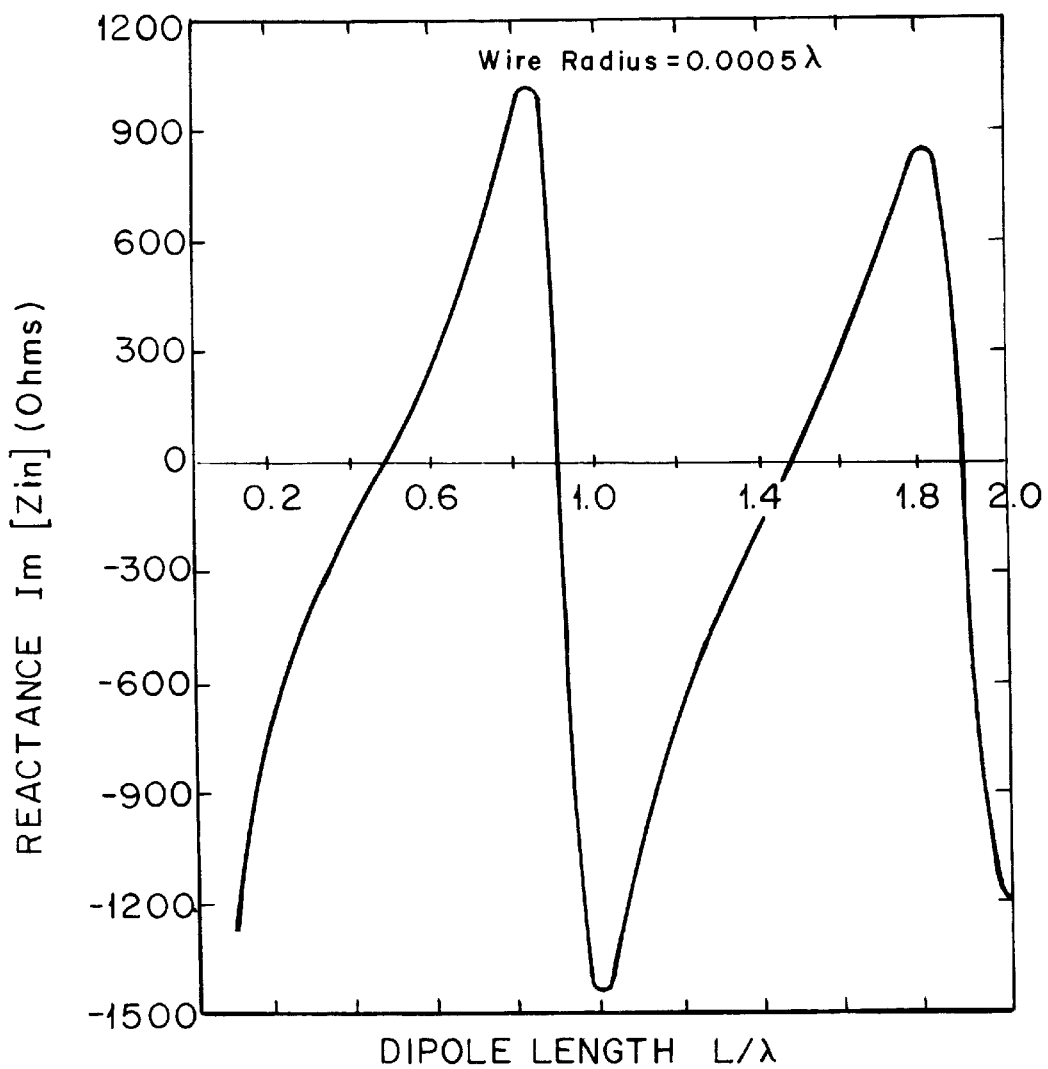
FIG. 7B is a graph of antenna reactance versus antenna electrical length, which is known in the prior art.
Figure 8:
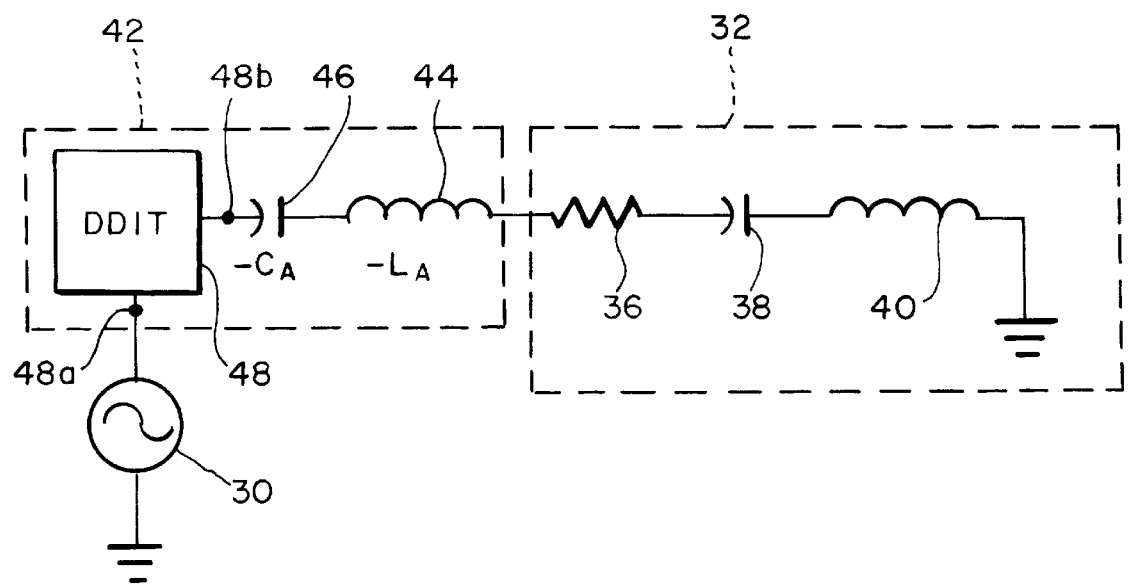
FIG. 8 is a representative electrical diagram of a broadband antenna matching circuit formed in accordance with the present invention.

FIG. 8 is a simplified schematic diagram of a broadband antenna impedance matching circuit 42 formed in accordance with the present invention. The matching circuit 42 is shown in cooperation with a signal source 30 and antenna 32. The antenna 32 is further illustrated as an electrical equivalent series circuit previously described in connection with FIG. 6. In this configuration, a signal transmission antenna system is described; however, it will be appreciated that signal source 30 may be replaced with a signal receiver and the other circuitry modified to accommodate a signal reception system.

Figure 9:
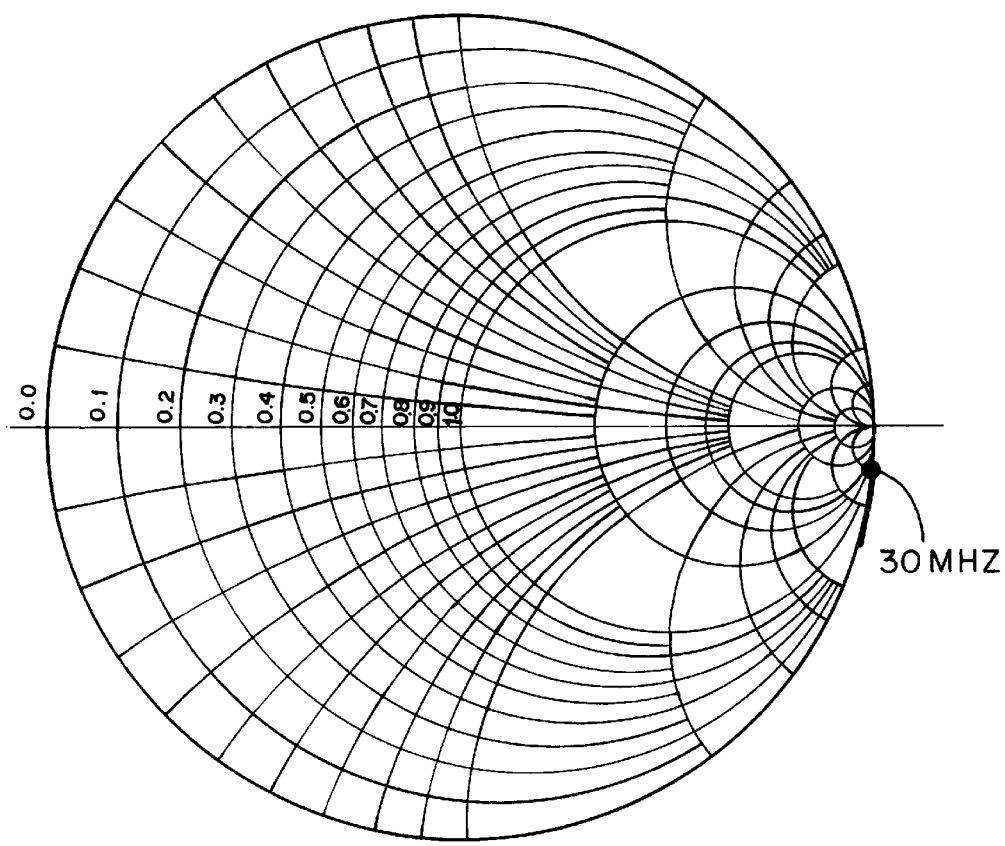
FIG. 9 is a graphical impedance chart, specifically a Smith chart, illustrating the impedance of a dipole antenna over a range of frequencies.

The theoretical model of the antenna equivalent circuit 32 includes an ideal capacitance 38, an ideal inductance 40 and a radiation resistance 36. As previously described, the radiation resistance 36 of the electrically small antenna varies with frequency. FIG. 9 graphically represents the impedance characteristic of an exemplary symmetrical center-fed dipole over a range of frequencies. The exemplary dipole has a length of 100 centimeters (cm), a diameter of 25 millimeters (mm) and is characterized from 30 to 88 MHZ. While the principles of the present invention will be described in connection with a dipole antenna, it will be appreciated that any electrically small antenna may be used. Other such antennas include loop antennas, slot antennas, monopoles extending over a ground plane and the like.

It was mentioned previously that an electrically small antenna is commonly defined as one having an electrical length significantly less than one-half wavelength. For the most part, such an electrically small antenna has a radiation resistance which varies proportionally to the square of frequency, as shown in the graph of FIG. 9A over a portion of the curve designated as Segment A in FIG. 9A. As the length of a dipole, for example, approaches one-half wavelength, this proportionality becomes less true, as exemplified by the portion of the curve designated as Segment B in FIG. 9A. It is to be understood that this invention is applicable to not only true electrically small antennas whose radiation resistance more closely follows the square of frequency, but is also applicable to antennas which are larger and exhibit radiation resistances which do not follow the square of frequency.

Figure 1:
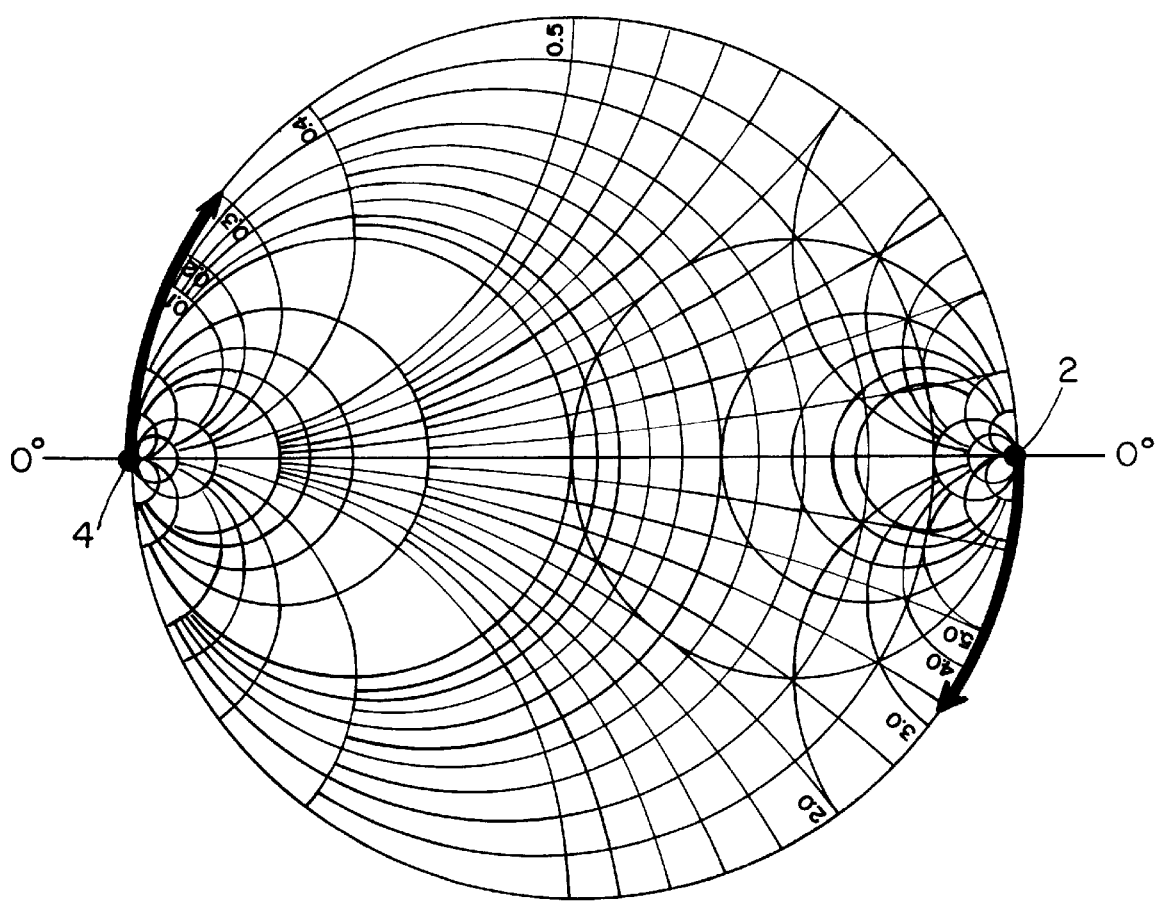
FIG. 1 is a graphical impedance chart, specifically a Smith chart, illustrating the behavior of standard capacitors and inductors over varying frequency.
Figure 2:
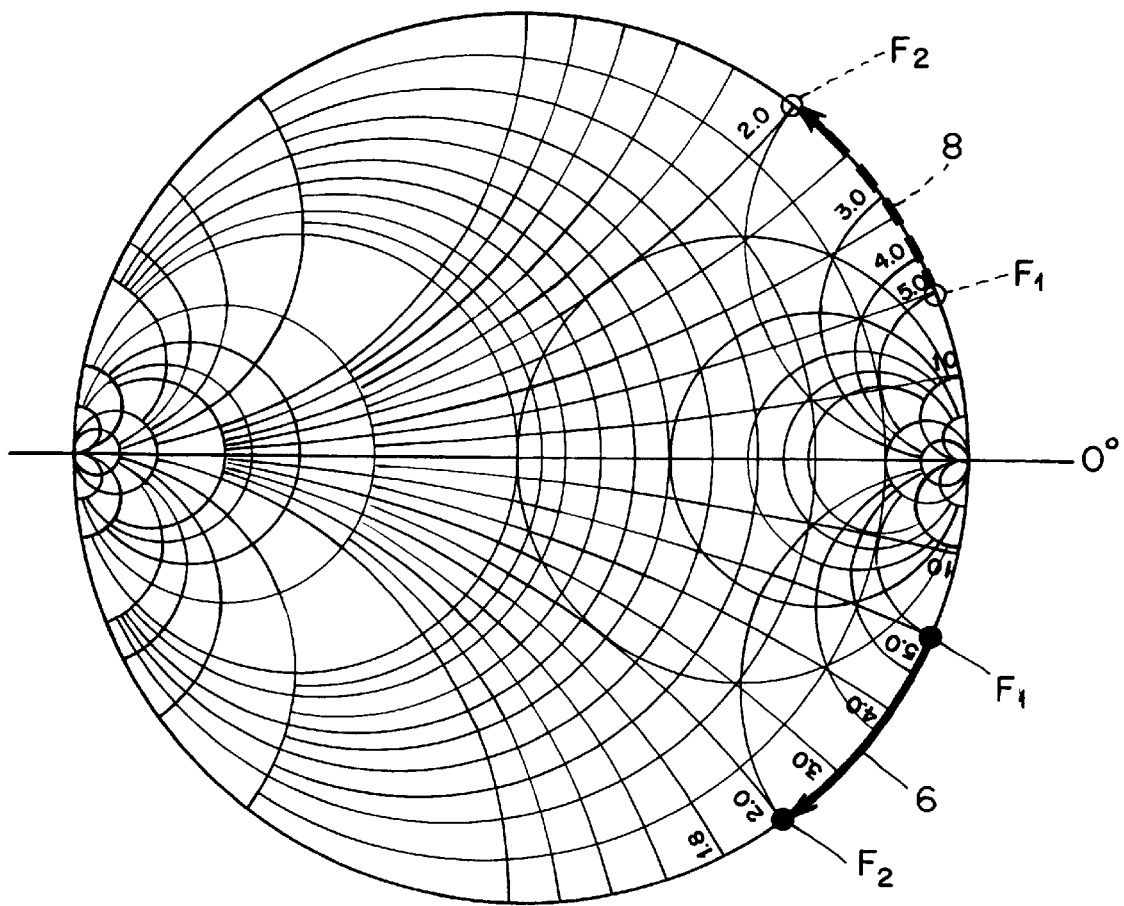
FIG. 2 is a graphical impedance chart, specifically a Smith chart, illustrating the behavior of a negative capacitor circuit, in relationship to a standard capacitor, over varying frequency.
Figure 3:
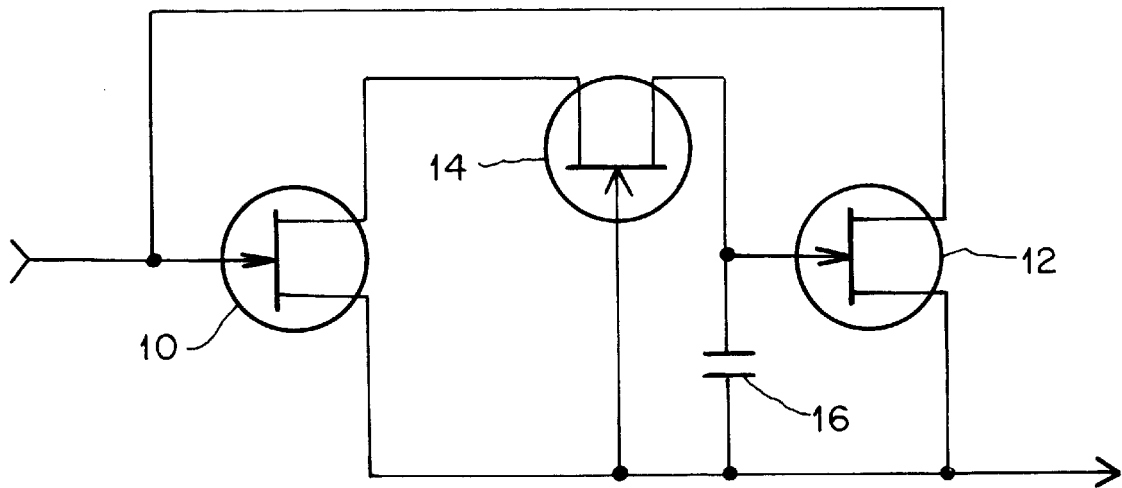
FIG. 3 is a schematic diagram of a negative inductor circuit known in the prior art.
Figure 4:
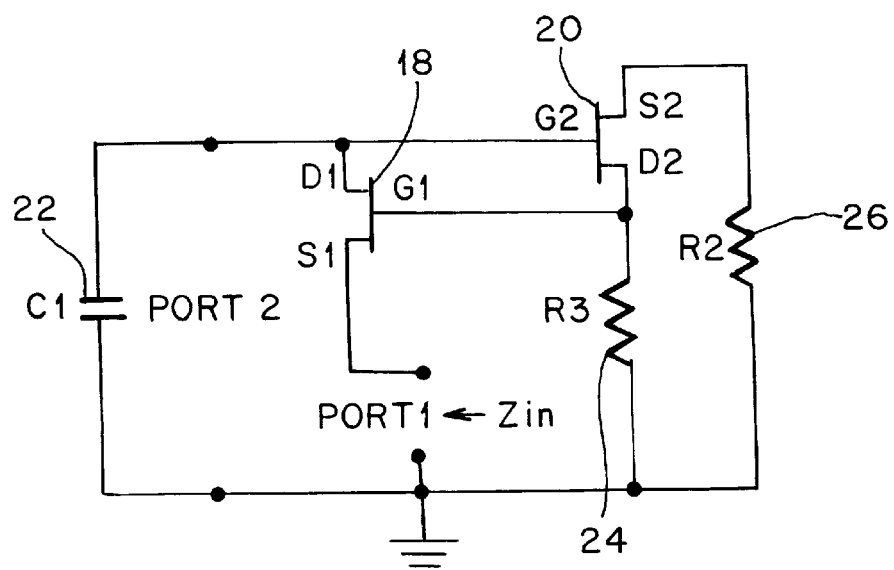
FIG. 4 is a schematic diagram of a negative capacitor circuit known in the prior art.
Figure 5:
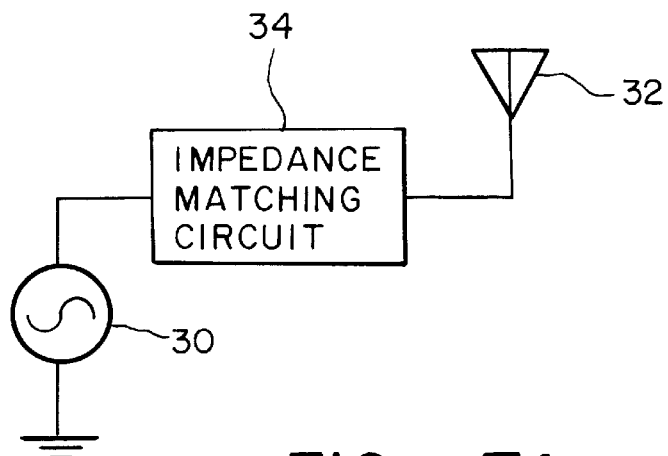
FIG. 5 is a simplified electrical block diagram of a signal source driving an impedance matching circuit and antenna, known in the prior art.
Figure 7A:
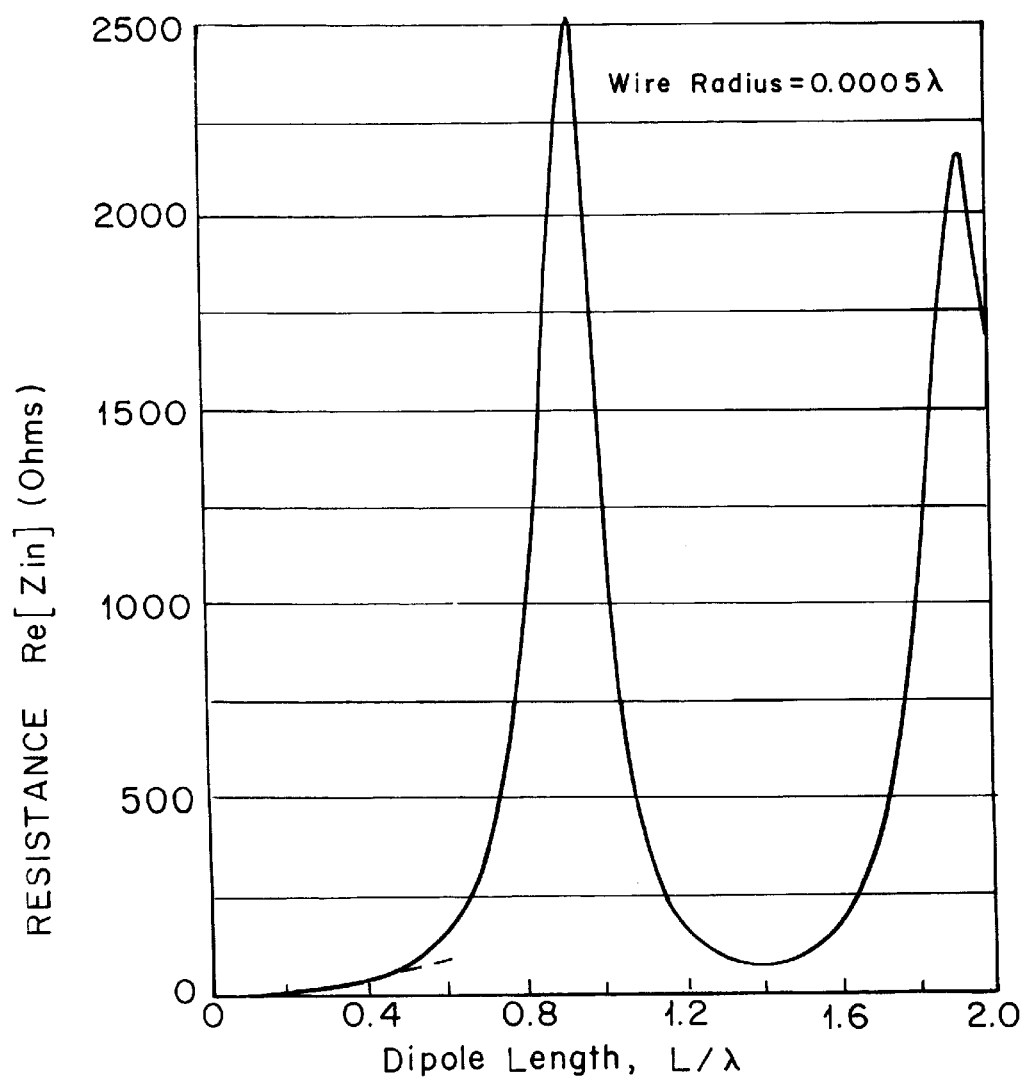
FIG. 7A is a graph of antenna resistance versus antenna electrical length, which is known in the prior art.
Figure 10:
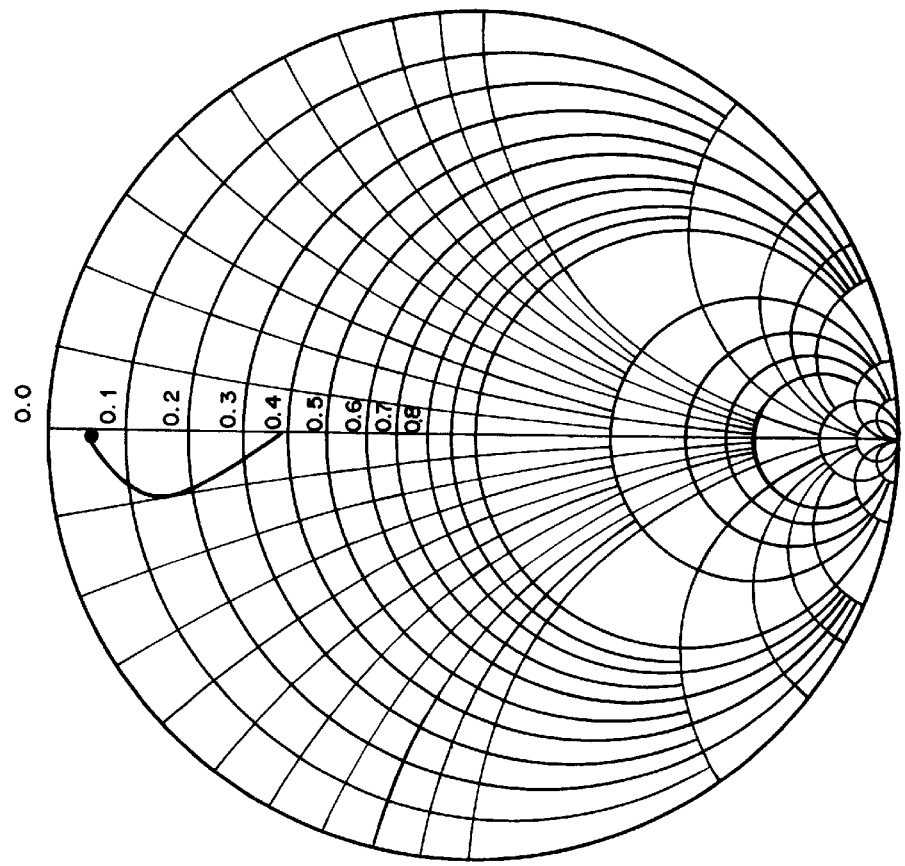
FIG. 10 is a graphical impedance chart, specifically a Smith chart, illustrating the impedance of a dipole antenna compensated with a matching circuit including a negative capacitor circuit and negative inductor circuit, formed in accordance with the present invention.

The matching circuit 42 uses non-Foster reactance circuits, such as those illustrated in FIGS. 3 and 4, to cancel the reactance presented by the antenna 32. For a dipole antenna, the matching circuit 42 includes a negative inductor circuit 44 and negative capacitor circuit 46 coupled in series with each other and with the antenna 32. Because both the negative capacitor circuit 46 and negative inductor circuit 44 are connected in series, a two port circuit topology for each of these elements is required. The magnitude of the negative inductance of the negative inductor circuit 44 is selected to be substantially equal and opposite to the value of the antenna inductance 40. Similarly, the negative capacitor circuit 46 is selected to have a capacitance value substantially equal and opposite to the value of the antenna capacitance 38. This ensures that the reactive components of the antenna impedance will be substantially canceled at all frequencies. FIG. 10 is a Smith chart illustrating the impedance characteristic of the antenna characterized in FIG. 9 with the addition of the negative inductor circuit 44 and negative capacitor circuit 46.

It will be appreciated that for other antenna configurations, such as small loops, magnetic dipoles, slot antennas and the like, the circuit topology of the matching circuit 42 will vary to neutralize the Foster reactance presented by each antenna. For those antennas, a parallel resonant circuit is generally required with the negative capacitor circuit 46 being connected in parallel with the negative inductor circuit 44.

After the reactive components of the antenna impedance are substantially eliminated, the impedance is dominated by the radiation resistance 36 of the antenna. Referring to FIG. 10, it is noted that the impedance behavior deviates from the line depicting a pure resistance. This is because the antenna 32 only approximates a pure R-L-C circuit.

The radiation resistance 36 is frequency dependent, and defines a line, rather than a single point, in FIG. 10. Therefore, the impedance transformation of the radiation resistance 36 must also be frequency dependent in order to achieve a broadband impedance match. However, traditional impedance transformers known in the prior art present a fixed transformation ratio which is independent of frequency.

Figure 11:
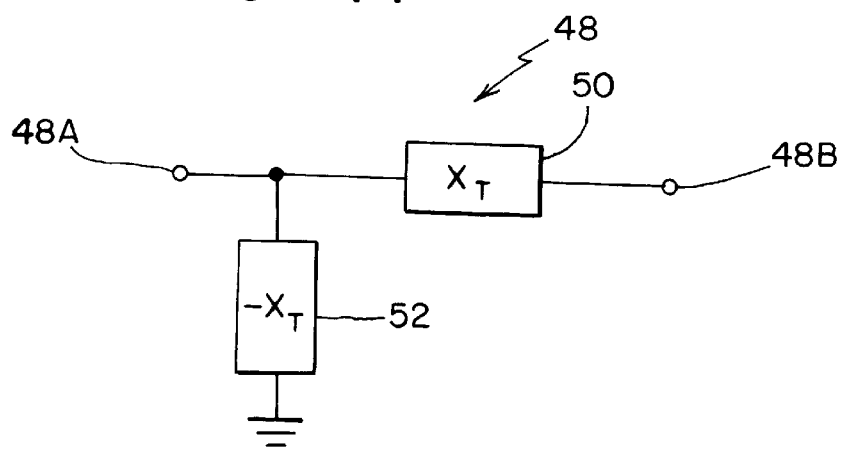
FIG. 11 is a representative electrical diagram of a frequency dynamic dispersive transformer, formed in accordance with the present invention.

An important aspect of the present invention is the inclusion of a dynamic dispersive impedance transformer (DDIT) 48. The simplest embodiment of the DDIT 48, illustrated in FIG. 11, is formed as an L-network which includes a source terminal 48a and a load terminal 48b. The DDIT 48 includes a first reactive element 50 and a second reactive element 52. Either the first reactive element 50 or second reactive element 52 is formed as a non-Foster reactance circuit while the other is formed as a Foster reactance circuit. In the exemplary embodiment shown in FIG. 8, the first reactive element 50 is connected in series between the signal source 30 and the non-Foster resonant circuit formed by the negative capacitor circuit 46 and negative inductor circuit 44, and the second reactive element 52 is connected in shunt from the junction of the first reactive element 50 and signal source 30 to circuit ground. Preferably, one of the first and second reactive elements 50, 52 is a negative inductor circuit with the inductance of the first inductive element 50 selected to be substantially equal and opposite to that of the second inductive element 52. Alternatively, the first and second reactive elements 50, 52 may take the form of equal and opposite capacitance circuits.

The operation of the L-network DDIT 48 will be described in terms of a mathematical derivation. Because the inductive and capacitive elements of the antenna impedance have been substantially canceled by the use of the negative inductor circuit 44 and negative capacitor circuit 46 respectively, the only remaining component of the antenna impedance is the radiation resistance 36. The radiation resistance 36 of the antenna may be expressed generally as:

$$R_R = \left(\frac{\omega}{\omega_O}\right)^2 R_{RO}$$

where $\omega$ is a radian frequency of interest, $\omega_o$ is an initial radian frequency and $R_{RO}$ is the radiation resistance at $\omega_o$. With the radiation resistance 36 presented to the load terminal 48b of the circuit of FIG. 8, the admittance (reciprocal of impedance) at the source terminal 48a of the circuit may be expressed as:

$$Y = -\frac{1}{j\omega L_1} + \frac{1}{R_R + j\omega L_2}$$

where $j=\sqrt{(-1)}$ and L1 and L2 represent the values of the first and second reactive elements 50, 52 respectively. When L1 is selected to be a positive inductance and L2 is selected to be −L1, the impedance at the source terminal 48a to the DDIT may be simplified and expressed as:

$$Z = \frac{\omega_0^2 L^2}{R_{RO}} + j\omega L$$

where $\omega_o$, $R_{RO}$ and L are constants.

Figure 12:
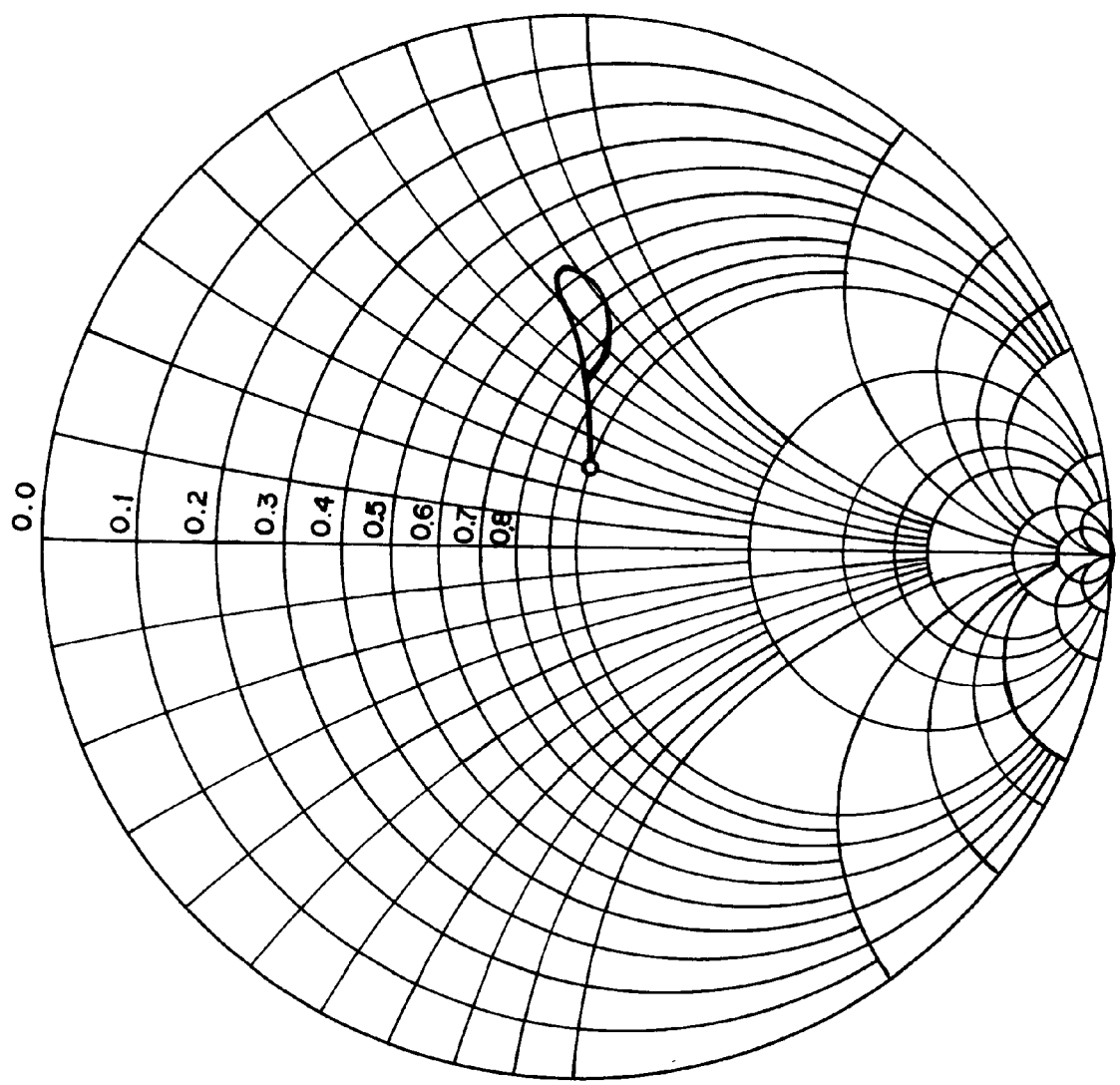
FIGS. 12 and 13 are graphical impedance charts, specifically Smith charts, illustrating exemplary impedance characteristics of antennas compensated in accordance with the present invention.
Figure 14:
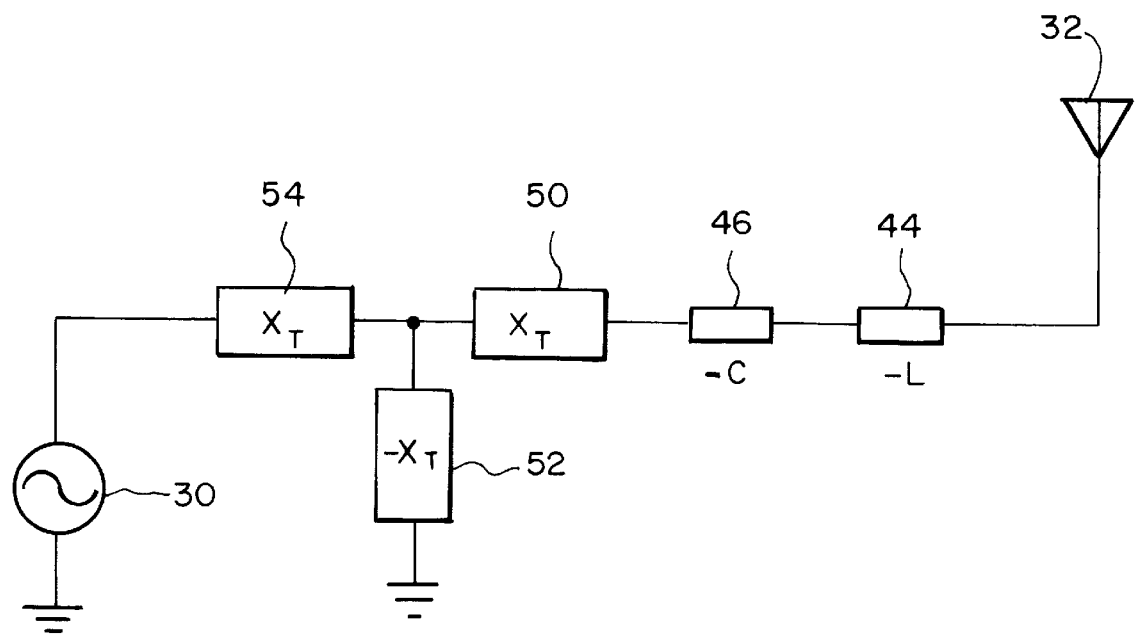
FIG. 14 is a block diagram of an active antenna impedance matching circuit formed in accordance with the present invention.

From this equation it can be seen that Z, the transformed radiation resistance, is equivalent to that of a standard inductor of inductance L, plus a constant. By adding an additional negative inductor circuit 54 (FIG. 14) between the source 30 and the source terminal 48a of the DDIT 48, this inductive reactance is substantially eliminated, resulting in a substantially constant impedance being presented to the source 30 over a broad range of frequencies. This response is graphically illustrated in the Smith chart of FIG. 12. If the antenna 32 actually behaved like a perfect R-L-C circuit, the graph of FIG. 12 would be a single point, representing a constant impedance over all frequencies. FIG. 14 illustrates the complete illustrative topology of the DDIT 48, formed as a T-network with three reactive circuits 50,52,54. Those skilled in the art will appreciate that a π-network can also accomplish the desired impedance transformation function in many applications. In this topology, the three reactive circuits 50,52,54 are configured with two shunt elements separated by an interposed series element.

If the shunt inductive element, L2, is selected to be a positive value with L1 being equal to -L2, the circuit impedance is expressed as:

$$Z = \frac{\omega_0^2 L^2}{R_{RO}} - j\omega L$$

Figure 13:
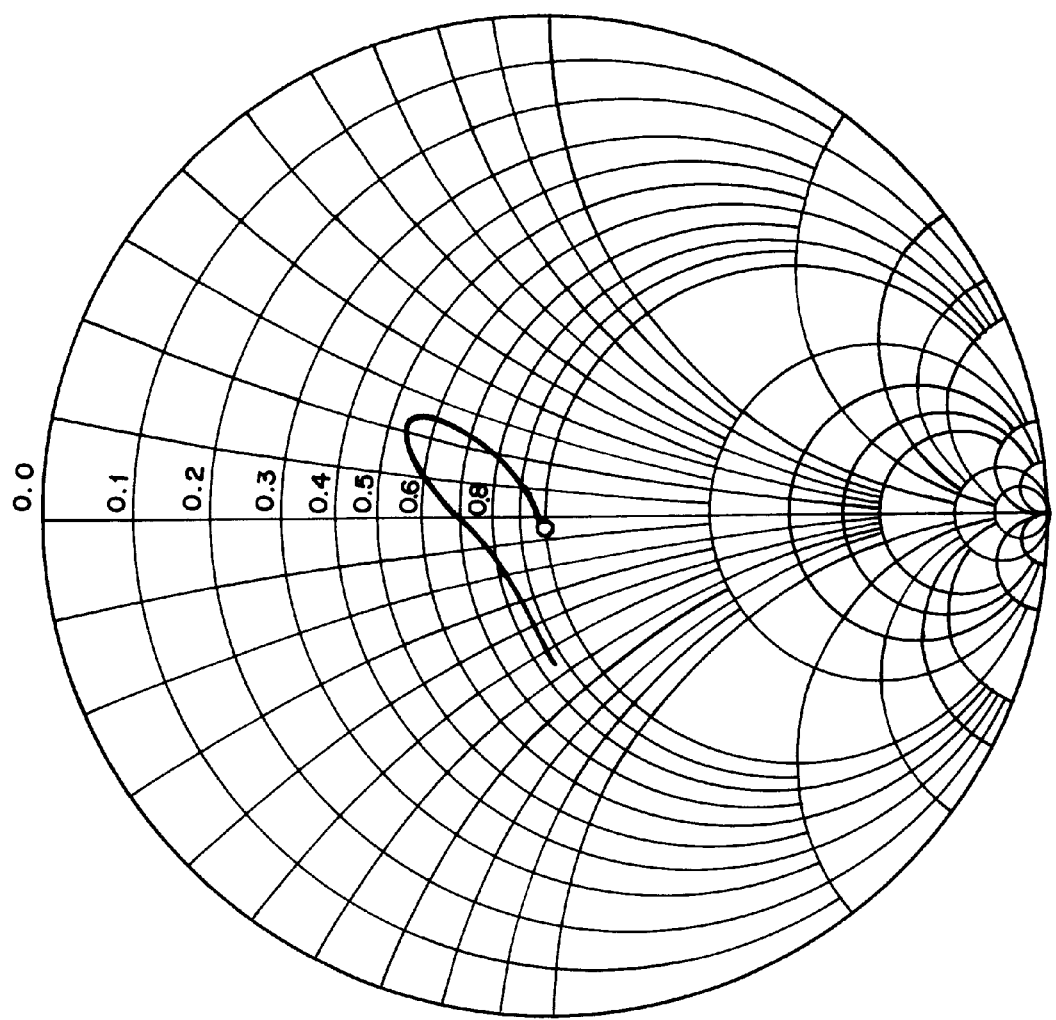

In this case, the frequency dependent reactance is preferably substantially eliminated by using a series positive inductance (54, FIG. 14). This response is graphically illustrated in the Smith chart of FIG. 13. Again, this graph would collapse into a single constant impedance point over all frequencies if the antenna functioned as an ideal circuit.

A complete active antenna impedance matching circuit embodiment is illustrated in the block diagram of FIG. 14. The circuit topologies for the negative inductor circuits and negative capacitor circuits can take the form of any suitable active circuit, such as those illustrated in FIGS. 3 and 4 respectively. Preferably, the field effect transistors used to implement these circuits are GaAs MESFET devices, with high values of cutoff frequency, conventionally termed $f_1$, such as part number FLR016XP manufactured by Fujitsu Microelectronics, Inc. of San Jose, Calif. The circuit bias conditions and operating parameters are ideally optimized utilizing computer aided design and analysis tools such as Super Star Professional™ manufactured by Eagleware of Stone Mountain, Ga., or Touchstone™ and Libra™ manufactured by EEsof of Westlake Village, Calif.

FIG. 14 illustrates the individual functional blocks which together form the broadband impedance matching circuit formed in accordance with the present invention. However, it is possible, and contemplated, that such a topology may be further simplified. For example, the combined frequency response of two or more of the negative inductor circuit 44, negative capacitor circuit 46, and $X_T$ 50 in series may be generated by a single, simplified active circuit which is modeled to create a non-Foster reactance which neutralizes the reactance of the antenna.

Figure 15:
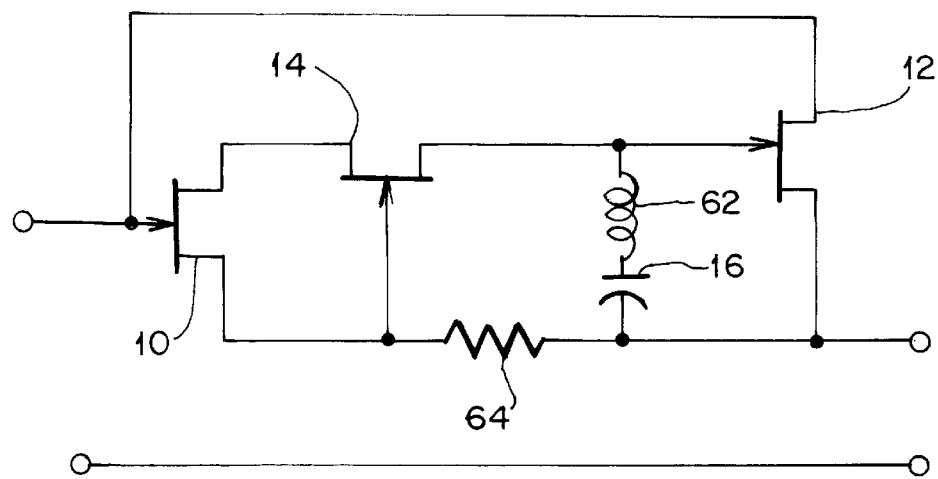
FIG. 15 is a simplified schematic diagram of a general non-Foster reactance circuit formed in accordance with the present invention.

FIG. 15 is a simplified schematic diagram of a non-Foster reactance circuit which provides a more general reactance characteristic. The circuit illustrated is similar to that of FIG. 3, and corresponding parts have been similarly numbered. Two additions have been made to the circuit of FIG. 3 in order to provide a more stable, general purpose, non-Foster reactance circuit. First, a small inductor 62 has been added in series with capacitor 16. This inductor, which may take the form of parasitic inductance from bonding wires, allows the circuit to first behave as a negative capacitance, transition through resonance and then behave as a negative inductor circuit. Essentially, this allows a single active circuit to neutralize the frequency dependent response of a passive resonant circuit.

The second addition to the circuit of FIG. 3 is the inclusion of a small resistance 64 interposed between the gate terminal of FET 14 and the series combination of the capacitor 16 and inductor 62, as shown in FIG. 15. The resistor 64 provides a small amount of dissipative loading which significantly improves the broadband stability of the circuit.

Figure 16:
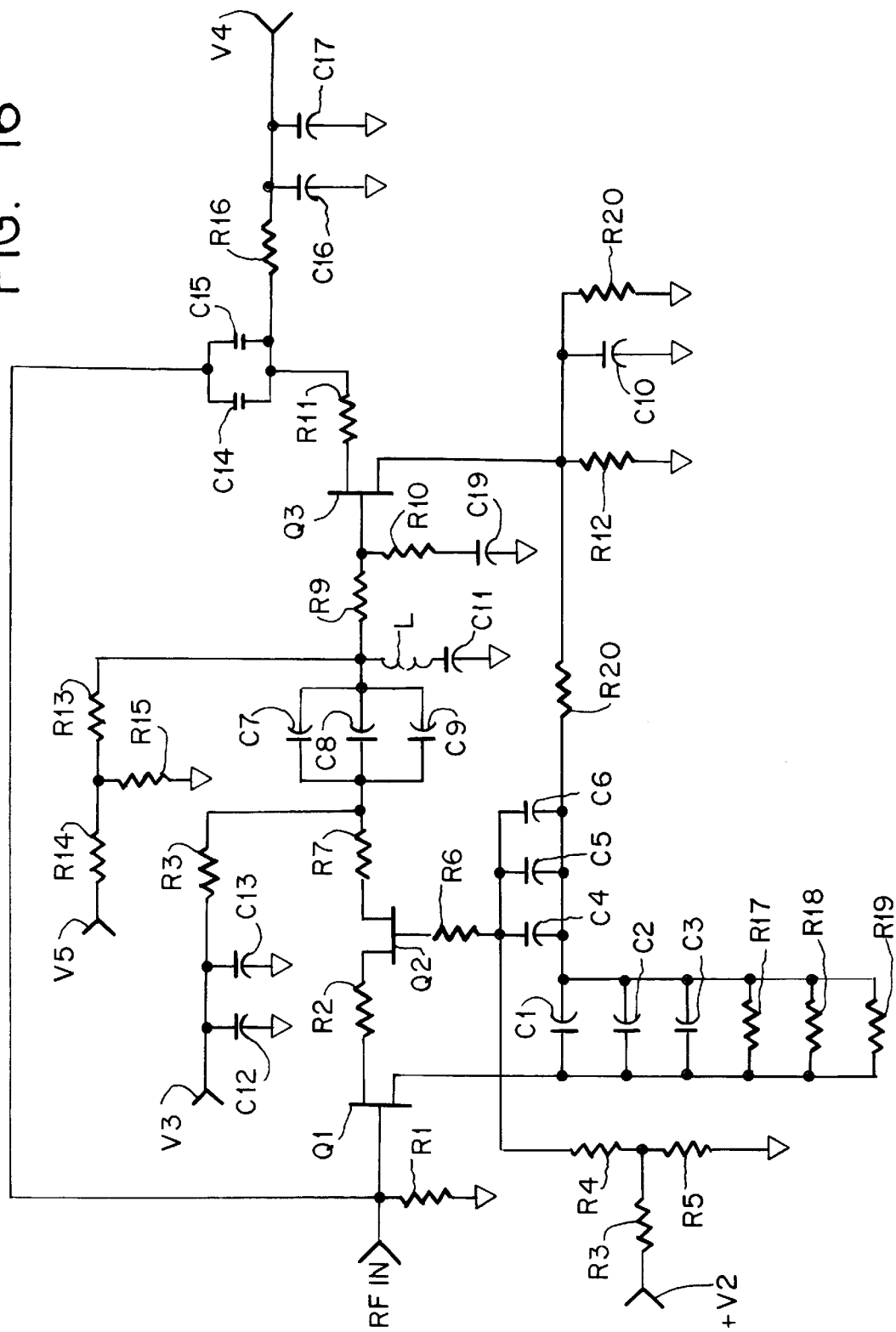
FIG. 16 is a schematic diagram of a non-Foster reactance circuit formed in accordance with the present invention.

FIG. 16 illustrates an example of a schematic diagram embodying the circuit of FIG. 15, including the necessary biasing components. As with the embodiment illustrated in FIG. 15, the circuit of FIG. 16 includes an input FET Q1, a coupling FET Q2 and an output FET Q3. The drain of the input FET Q1 is coupled to the source of the coupling FET Q2 through resistor R2. A resistor R1 is connected from the gate of Q1 to circuit ground, providing a terminating impedance for the input of the non-Foster reactance circuit. A feedback path is included from the drain of output FET Q3 to the gate of the input FET Q1 through resistor R11, which is connected in series with parallel capacitors C14 and C15. A bias voltage, V4, is applied to the drain of the output FET Q3 through resistor R16, which is connected at the junction of C14, C15 and R11. Bypass capacitors C16 and C17 are provided to eliminate noise from the bias voltage applied to Q3.

The source of the input FET Q1 is coupled to the gate of coupling FET Q2 through a series circuit formed by a first parallel circuit which includes capacitors C1, C2, C3 and resistors R17, R18 and R19, and also a second parallel circuit which includes capacitors C4, C5 and C6 and finally a resistor R6. A DC return path for the source of the input FET Q1 is provided by a resistor R20 which is connected to the junction of the first and second parallel circuits and resistors R12 and R21 which are connected to ground. The source of output FET Q3 is also connected to the junction of R12, R20 and R21. A first bias tee, including resistors R3, R4 and R5, is interposed between an external voltage source, V2, and the junction of R6 and the second parallel circuit. The first bias tee provides a bias voltage to the gate of the coupling FET Q2.

The source of the coupling FET Q2 is coupled to the gate of the output FET Q3 by a resistor R7 in series with a third parallel circuit including capacitors C7, C8 and C9 which in turn is connected to resistor R9. A series R-C circuit including resistor R10 and capacitor C18 is connected from the gate of the output FET Q3 to circuit ground and provides a low pass function which enhances circuit stability. A series LC circuit, including inductor L1 and capacitor C11, is connected to the junction of R9 and the third parallel circuit. L1 is equivalent to inductor 62 in FIG. 15 and capacitor C11 is equivalent to capacitor 16 in FIG. 15.

A bias voltage is applied to the source of coupling FET Q2 through resistor R3 which is interposed between an external voltage source, V3, and the junction of resistor R7 and the third parallel circuit. Parallel capacitors C12 and C13 are coupled from the V3 input terminal to circuit ground and provide a bypass function for this voltage source. A second voltage bias tee, including resistors R13, R14, and R15, is interposed between an external voltage source, V5, and the junction of resistor R9 and the third parallel circuit. This circuit arrangement provides a bias voltage for the gate of output FET Q3.

Figure 17:
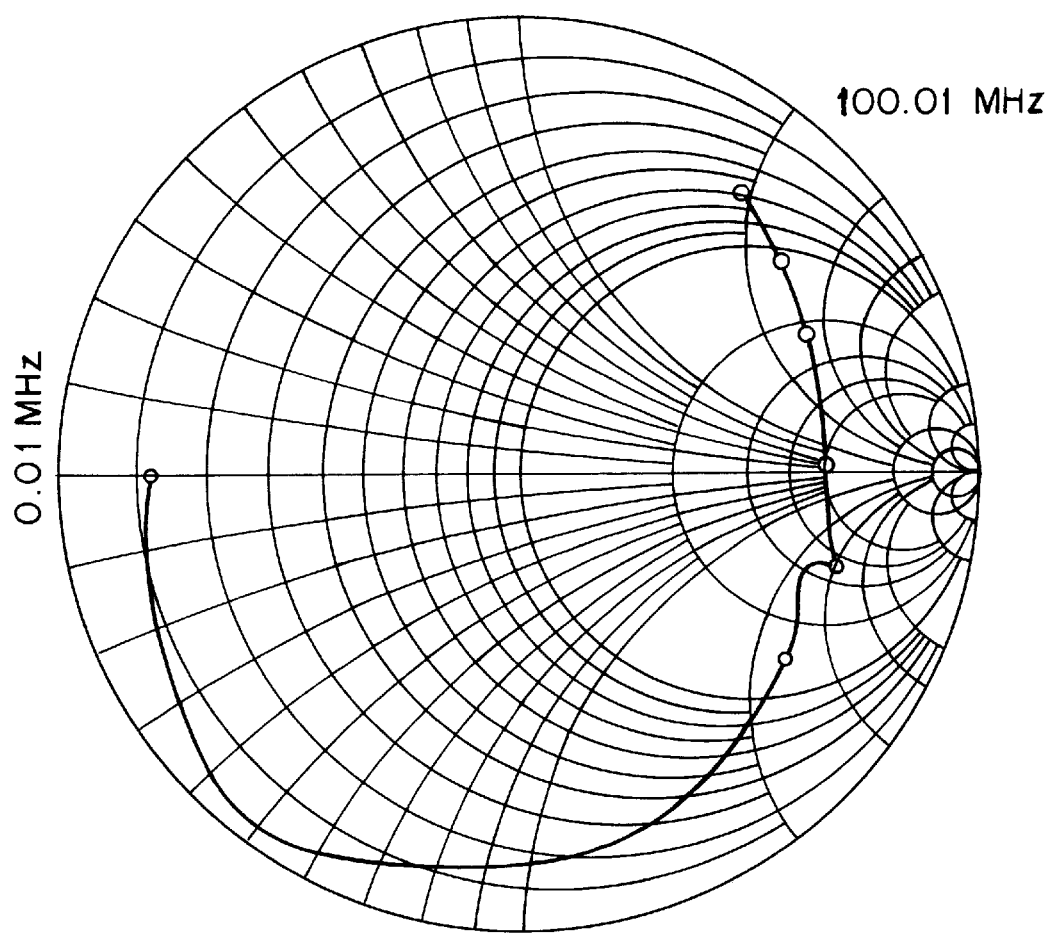
FIG. 17 is a graphical impedance chart, specifically a Smith chart, illustrating exemplary impedance characteristics of an antenna compensated in accordance with the present invention.

This circuit was modeled using the EEsof™ microwave analysis software and optimized over a frequency band from 30 to 88 MHZ. The theoretical results are depicted in the Smith chart shown in FIG. 17. The component values for this exemplary embodiment are listed in Table 1 below:

TABLE 1

| Component | Value | Comment |
|---|---|---|
| Q1, Q2, Q3 | FLR 016XP | GaAS MESFET |
| R1, R4, R13 | 10,000Ω | Resistor |
| R2, R6, R7, R9–R12 | 10Ω | Resistor |
| R3, R5, R14–16 | 1000Ω | Resistor |
| R8 | 500Ω | Resistor |
| R17 | 20Ω | Resistor |
| R18 | 30Ω | Resistor |
| R19 | 40Ω | Resistor |
| R20 | 5Ω | Resistor |
| C1, C4, C7, C18 | 100 pf | Capacitor |
| C2, C5, C8, C12, C14, C16 | 600 pf | Capacitor |
| C3, C6, C9, C13, C15, C17 | 100,000 pf | Capacitor |
| C10 | 6800 pf | Capacitor |
| C11 | 820 pf | Capacitor |
| L | 12 MH | Inductor |
| V2 | +4 to +5 VDC | |
| V3 | 19.6 VDC | |
| V4 | 28.9 VDC | |
| V5 | −1.0 to −0.5 VDC | |

Preferably, the circuit is constructed using hybrid chip and wire construction to minimize circuit parasitics. In addition, the circuit is preferably fabricated on a 0.010 inch thick alumina substrate with plated through via holes to a continuous ground plane to provide reliable, low inductance connections to circuit ground as required to avoid circuit instability. It will be appreciated that fairly large value drain resistors (R3, R16) should be employed to prevent degradation of the Q of the inductor. Also, to provide adequate low frequency coupling, large capacitance values are required. To achieve the desired capacitance without suffering from low frequency resonances, several smaller value, resonance free, metal nitride capacitors should be connected in parallel (i.e., C1, C2 and C3; C7, C8 and C9).

From the foregoing description, it will be appreciated by those skilled in the art that electrically small antennas which are, indeed, electrically small at their lower frequencies of operation but which are large enough such that their radiation resistances do not follow the square of frequency at their higher operating frequencies, matched in accordance with the present invention, provide enhanced broadband performance not previously attainable. The matching circuit of the present invention employs non-Foster reactance circuits to neutralize the Foster reactance presented by an electrically small antenna. The present invention also employs a dynamic dispersive impedance transformer which receives the frequency dependent radiation resistance and provides a substantially constant resistance over frequency at an output terminal. Thus formed, an antenna matched in accordance with the present invention overcomes the fundamental limitation of small antennas, which is stated through Fano's gain-bandwidth theorem, that an electrically small antenna's gain-bandwidth product is limited by its effective volume. Accordingly, the apparatus and method for broadband impedance matching of electrically small antennas of the present invention significantly enhances the performance of electrically small antennas known in the prior art.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A broadband impedance matching circuit for interfacing an antenna to one of a signal source and a load, the antenna exhibiting a frequency dependent Foster reactance and a frequency dependent radiation resistance, the matching circuit comprising:

a non-Foster reactance circuit operatively coupled to the antenna, the non-Foster reactance circuit being selected to neutralize the Foster reactance of the antenna; and a dynamic dispersive impedance transformer circuit, the dynamic dispersive impedance transformer circuit being operatively coupled to the non-Foster reactance circuit and effectively transforming the frequency dependent radiation resistance of the antenna into a substantially frequency independent resistance, the dynamic dispersive impedance transformer circuit being further coupled to one of the source and the load.

2. A broadband impedance matching circuit as defined by claim 1, wherein the dynamic dispersive impedance transformer circuit comprises:

a first reactance circuit having a first reactance value; and a second reactance circuit, the second reactance circuit having a second reactance value, one of the first reactance circuit and second reactance circuit exhibiting non-Foster reactance with the second reactance value being selected to be substantially equal and opposite to the first reactance value, the first reactance circuit and second reactance circuit being operatively configured as an L-network.

3. A broadband impedance matching circuit as defined by claim 2, wherein the dynamic dispersive impedance transformer circuit further comprises a third reactance circuit, the third reactance circuit having a reactance value substantially equal to the reactance value of the first reactance circuit, the dynamic dispersive impedance transformer circuit being operatively configured as a T-network.

4. A broadband impedance matching circuit as defined by claim 2, wherein the dynamic dispersive impedance transformer circuit further comprises a third reactance circuit, the third reactance circuit having a reactance value substantially equal to the reactance value of the first reactance circuit, the dynamic dispersive impedance transformer circuit being operatively configured as a π-network.

5. A broadband impedance matching circuit for interfacing an antenna to one of a signal source and a load, the matching circuit comprising:

a negative capacitor circuit;

a negative inductor circuit, the negative capacitor circuit and negative inductor circuit being connected as a resonant circuit having a first and second terminal, the first terminal being electrically connected to the antenna; and a dynamic dispersive impedance transformer circuit, the dynamic dispersive impedance transformer circuit comprising:

a first reactance circuit, the first reactance circuit having a first terminal, a second terminal and a reactance associated therebetween, the first terminal being connected to the second terminal of the resonant circuit; and a second reactance circuit, the second reactance circuit having a first terminal, a second terminal and a reactance associated therebetween, the reactance of the second reactance circuit being selected to be equal and opposite to the reactance of the first reactance circuit, the first terminal of the second reactance circuit being connected to the second terminal of the first reactance circuit and serving as an output terminal for the dynamic dispersive impedance transformer circuit for connection to one of the signal source and the load, the second terminal of the second reactance circuit being electrically coupled to circuit ground, the dynamic dispersive impedance transformer circuit receiving a first signal having a frequency dependent radiation resistance component from the antenna and transforming the first signal into a second signal having a substantially constant real resistance, the dynamic dispersive impedance transformer circuit providing the second signal at the output terminal.

6. A broadband impedance matching circuit for an antenna as defined by claim 5, wherein the dynamic dispersive impedance transformer circuit further comprises:

a third reactance circuit, the third reactance circuit having a first terminal, a second terminal and a reactance associated therebetween, the first terminal of the third reactance circuit being connected to the junction of the first reactance circuit and second reactance circuit, the second terminal of the third reactance circuit serving as an output terminal for connection to one of the signal source and the load.

7. A broadband impedance matching circuit for an antenna as defined by claim 6, wherein the reactance of the first reactance circuit is a positive inductive reactance.

8. A broadband impedance matching circuit for an antenna as defined by claim 6, wherein the reactance of the first reactance circuit is a negative inductive reactance.

9. A broadband impedance matching circuit for an antenna as defined by claim 6, wherein the reactance of the first reactance circuit is a positive capacitive reactance.

10. A broadband impedance matching circuit for an antenna as defined by claim 6, wherein the reactance of the first reactance circuit is a negative capacitive reactance.

11. A broadband impedance matching circuit for an antenna as defined by claim 5, wherein the antenna is a dipole and wherein the resonant circuit is in the form of a series resonant circuit.

12. A broadband impedance matching circuit for an antenna as defined by claim 5, wherein the antenna is a monopole element extending substantially perpendicularly over a ground plane and wherein the resonant circuit is in the form of a series resonant circuit.

13. A broadband impedance matching circuit for an antenna as defined by claim 5, wherein the antenna is a loop antenna and wherein the resonant circuit is in the form of a parallel resonant circuit.

14. A broadband impedance matching circuit for an antenna as defined by claim 5, wherein the antenna is a slot antenna and wherein the resonant circuit is in the form of a parallel resonant circuit.

15. A dynamic dispersive impedance transformer circuit, the dynamic dispersive impedance transformer circuit comprising:

a first reactance circuit, the first reactance circuit having a first reactance associated therewith; and a second reactance circuit, the second reactance circuit having a second reactance associated therewith, one of the first reactance circuit and second reactance circuit being a non-Foster reactance circuit, the reactance of the second reactance circuit being selected to be substantially equal and opposite to the reactance of the first reactance circuit, the first reactance circuit and second reactance circuit being operatively configured as an L-network having an input terminal and an output terminal, the dynamic dispersive impedance transformer circuit receiving a first signal having a frequency dependent resistance component on the input terminal and transforming the first signal into a second signal having a substantially frequency independent resistance, the dynamic dispersive impedance transformer circuit providing the second signal at the output terminal.

16. A dynamic dispersive impedance transformer circuit as defined by claim 15, further comprising:

a third reactance circuit, the third reactance circuit having a third reactance associated therewith, the first, second and third reactance circuits being operatively coupled as one of a T-network and a π-network.

17. A method of broadband impedance matching an antenna with one of a signal source and a load, the antenna exhibiting a frequency dependent Foster reactance and a frequency dependent radiation resistance, which comprises the steps of:

neutralizing the Foster reactance of the electrically small antenna by operatively coupling thereto a circuit exhibiting a non-Foster reactance;

transforming effectively the frequency dependent radiation resistance of the antenna into a substantially frequency independent resistance by operatively coupling a dynamic dispersive impedance transformer circuit to the circuit exhibiting a non-Foster reactance; and operatively coupling the dynamic dispersive impedance transformer circuit to one of the signal source and the load.

\* \* \* \* \*